United States Patent [19]

Dutta et al.

[11] Patent Number: 5,008,734
[45] Date of Patent: Apr. 16, 1991

[54] STADIUM-STEPPED PACKAGE FOR AN INTEGRATED CIRCUIT WITH AIR DIELECTRIC

[75] Inventors: Vivek B. Dutta, Cupertino; Jeffrey C. Demmin, Mt. View; Mark L. DiOrio; Jon T. Ewanich, both of Cupertino, all of Calif.

[73] Assignee: National Semiconductor Corporation, Santa Clara, Calif.

[21] Appl. No.: 454,802

[22] Filed: Dec. 20, 1989

[51] Int. Cl.⁵ .................. H01L 23/12; H01L 23/48
[52] U.S. Cl. .................................... 357/74; 357/68; 357/80
[58] Field of Search .................. 357/74, 68, 72, 80, 357/71; 427/96; 437/215, 218

[56] References Cited

U.S. PATENT DOCUMENTS

| 3,676,748 | 7/1972 | Kobayashi et al. | 317/101 |
| 3,872,583 | 3/1975 | Beall et al. | 29/624 |
| 3,890,636 | 6/1975 | Harad et al. | 357/69 |
| 4,115,837 | 9/1978 | Beall et al. | 361/388 |
| 4,132,856 | 1/1979 | Hutchinson et al. | 174/52 |
| 4,296,456 | 10/1981 | Reid | 361/403 |
| 4,340,902 | 7/1982 | Honda et al. | 357/74 |
| 4,396,971 | 8/1983 | Beall et al. | 361/388 |
| 4,475,007 | 10/1984 | Onho | 174/52 |
| 4,513,355 | 4/1983 | Schroeder et al. | 23/2 |
| 4,551,746 | 11/1985 | Gilbert et al. | 357/74 |
| 4,630,172 | 12/1986 | Stenerson et al. | 361/386 |
| 4,677,526 | 6/1987 | Muehling | 361/386 |
| 4,705,917 | 11/1987 | Gates, Jr. et al. | 174/52 |
| 4,839,717 | 6/1989 | Phy et al. | 357/74 |
| 4,866,504 | 9/1989 | Landis | 357/70 |
| 4,872,260 | 10/1989 | Johnson et al. | 357/70 |
| 4,879,588 | 11/1989 | Ohtsuka et al. | 357/68 |
| 4,890,155 | 12/1989 | Miyagawa et al. | 357/74 |
| 4,891,687 | 1/1990 | Mallik et al. | 357/74 |

Primary Examiner—Rolf Hille
Assistant Examiner—S. V. Clark
Attorney, Agent, or Firm—Townsend and Townsend

[57] ABSTRACT

A package for containing an integrated circuit component is provided which includes one or more layers with exposed edges surrounding a central opening. The integrated circuit component is positioned in the central opening. Bond wires connect the bond pads of the integrated circuit component to the continuous shelves of the various stepped-back stadium-like layers as well as to individual insulated leads. The layers are spaced apart by beads or columns of insulative material and the major portion of the layers are separated from each other by a gaseous dielectric, preferably air. The R-C constant is reduced and the speed of transmission is increased by the presence of the low dielectric material providing a device which can function rapidly. The stepped portions of the layers are exposed to allow for electrical interconnections within the layers, as well as from each layer to the integrated circuit.

16 Claims, 3 Drawing Sheets

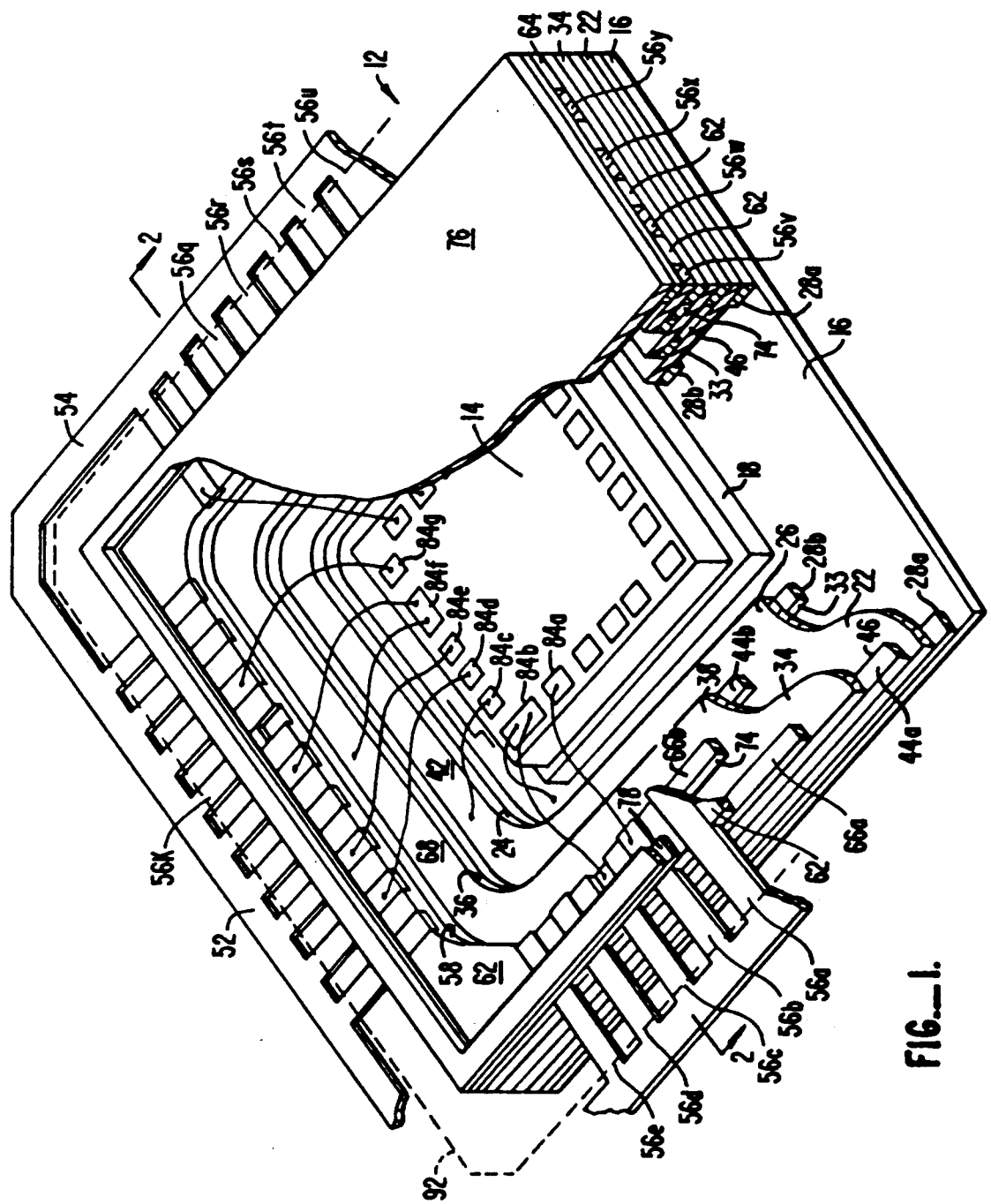
FIG._1.

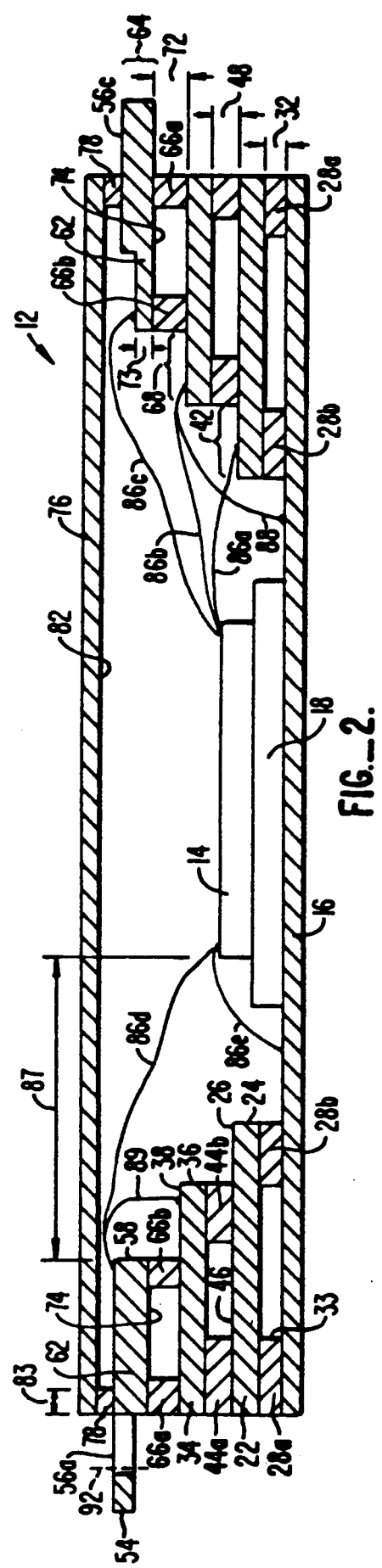
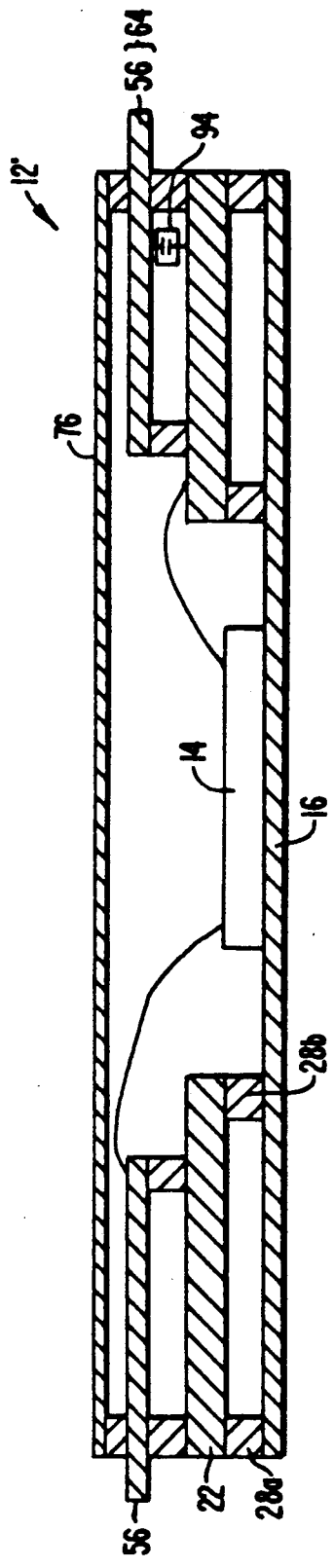

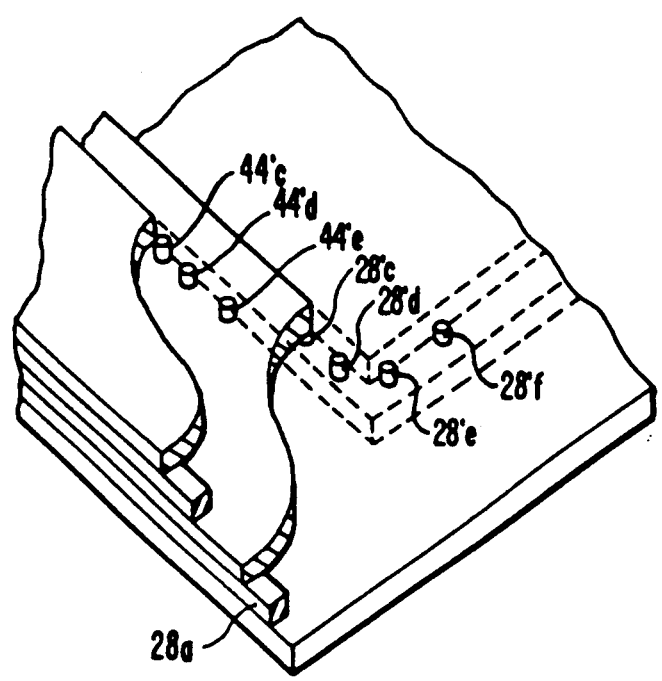
FIG._4.

STADIUM-STEPPED PACKAGE FOR AN INTEGRATED CIRCUIT WITH AIR DIELECTRIC

FIELD OF THE INVENTION

The present invention relates to a package for housing an integrated circuit component and providing electrical connections thereto. In particular, the invention relates to a package having multiple layers arranged in a stadium-stepped shape with an air dielectric between layers.

BACKGROUND OF THE INVENTION

Integrated circuits or "dice" are of such a small size that direct connection of the electrical connection "pads" to other circuitry is impractical. Accordingly, integrated circuits are housed in a larger device known as a "package" which contains conductive leads for providing electrical connections to the integrated circuit bonding pads.

Topology and manufacturing requirements for the conductive leads and other connections to the integrated circuit typically require that the package contain several overlying layers having conductive lines. To preserve the desired functionality of the device, these layers must be electrically insulated from one another. Typically, a layer of solid material such as a plastic, ceramic or glass has been provided between the layers to electrically insulate the layers from one another.

Such a previous configuration is depicted in U.S. Pat. No. 3,676,748 issued July 11, 1972 to Kobayashi et al. Kobayashi et al. also disclose providing two layers of leads located on different stepped planes, formed by using lead frames vertically spaced and insulated from each other.

SUMMARY OF THE INVENTION

The present invention includes the recognition of certain problems found in previous devices. The material previously used to insulate one layer from another is typically a material having a relatively high dielectric constant. For example, plastics, ceramics and glasses typically have a static dielectric constant (at standard temperature and pressure) of between about 2 and 13. Applicants have recognized that the use of insulation materials with relatively high dielectric constants leads to slowing of the time required for typical operation of the device. This slowing is related to at least two phenomena. One limiting factor on the speed of operation is the time required to discharge certain capacitance devices. This 15 time is directly related to the resistance-capacitance constant ("R-C constant"). The second phenomenon relates to the speed of propagation of signals through electrically conductive media. The speed of transmission is reduced below the speed of light to a degree which is directly related to the dielectric constant of material adjacent to the conductor.

The present invention involves providing a gas, preferably air, as the dielectric material between layers. Air has a dielectric constant which is quite low (about 1.0054), approaching that of a vacuum. The low dielectric constant reduces the effective R-C constant and thus reduces the time needed to discharge capacitive circuits. By providing a relatively low-dielectric constant insulator, propagation or transmission speed of signals is increased, approaching the speed of light.

Providing an air dielectric also affords other advantages. The space between layers can be used for accommodating electronic components which thus can be positioned physically close to the layers. Certain package configurations provide a bypass capacitor which connects two layers, for example, for use in providing rapid charging of a layer or lead when the value of a supply voltage switches from a high to a low value. According to the present invention, the speed with which such switching can be accomplished is increased by positioning the capacitor closer to the layers in the region between layers. A further advantage of using an air dielectric is that the conductive layers can be placed relatively close to one another, for example, with a spacing of about 0.004 to 0.006 inches (about 0.1 to 0.15 millimeters). A thin package is particularly useful for providing a thin profile component, for example, for surface mount devices.

Because packages are intended to be connected to other electronic components, a certain amount of handling and manipulation is necessary. For this reason, the leads extending from packages have been provided with a sufficient thickness to prevent damage during such manipulation and handling. The thickness of the leads, however, provides an undesirable amount of capacitance. The present invention includes providing leads which have a lesser thickness in the interior portion than in the portion of the leads which extends exterior to the package.

The present invention also includes providing one or more of the stepped-plane layers in a stadium-like configuration, i.e. in which the area to which bond wires are attached is a continuous shelf-like structure, rather than a plurality of individual pads or leads. This configuration permits connection of the bond wires in the necessary configuration, avoiding crossing or shorting of the bond wires, while still requiring only a single lead frame or plane for many applications. The stadium configuration provides for flexibility of the package in the sense that the stadium package can be used with a large number of different integrated circuit components or bond wire configurations without redesigning the package. This is because some of the bond wires going to a particular level can be connected anywhere along the shelf, rather than having to be connected to a particular pad or lead. The stadium configuration also provides for flexibility in permitting inter-layer connections, thus avoiding the need for vias to provide an electric pathway between layers and also permitting a wide variety of possible inter-layer connections without redesigning the package. The present invention includes a package with a ground plane which aids in reducing inductance.

The present invention also provides a superior thermal pathway from the integrated circuit component to a radiating surface of the package. In one embodiment, the integrated circuit component is mounted in direct contact with a base layer which has a relatively high thermal conductivity so that the base layer provides an efficient thermal transfer surface. In one embodiment, the base layer is also electrically conductive and an electric pathway is formed between portions of the integrated circuit component and the base layer.

BRIEF DESCRIPTION OF THE DRAWINGS

FIG. 1 is a perspective view, partly cut away showing the package of the present invention with an integrated circuit mounted and connected therein;

FIG. 2 is a cross-sectional view taken along line 2—2 of FIG. 1;

FIG. 3 is a cross-sectional view generally corresponding to FIG. 2 but showing an alternative embodiment of the present invention; and FIG. 4 is a detail of a cutaway view, similar to the view of FIG. 1, but showing insulation in the form of columns, as well as beads.

DETAILED DESCRIPTION OF THE PREFERRED EMBODIMENT

The present invention relates to a package for housing and connecting an integrated circuit component. FIG. 1 depicts a package 12 according to the present invention. The package 12 depicted in FIG. 1 also shows an integrated circuit component or die 14 positioned within the package 12.

The package 12 includes a base layer 16. The base layer 16 can be composed of a variety of materials including metals, plastics, ceramics, and the like. When it is important to dissipate heat from the integrated circuit component 14, the base layer 16 is preferably a material with high heat conductance having a thermal conductivity greater than about 2 watt cm$^{-1}$·K$^{-1}$. In one preferred embodiment, the base layer 16 is at least 90 weight percent copper, e.g., copper alloy known as C19400. The integrated circuit component 14 can be mounted on the base layer 16 using a pedestal 18 as shown in FIG. 2. Pedestal 18 can also be made of a number of materials, for example, if high thermal conductivity is desired, with electrical isolation, materials such as BeO or AlN could be used. In an alternative embodiment of the package 12' depicted in FIG. 3, the integrated circuit component 14 is mounted directly on the base layer 16 e.g., by an epoxy adhesive, to provide for efficient thermal transfer.

In the embodiment depicted in FIG. 1, the first stadium layer 22 is mounted overlying, but spaced from the base layer 16. The layer 22 includes at least a first conductive area and is preferably a sheet of conductive material, e.g., copper or a copper alloy. The first stadium layer 22 has a first central opening 24 defined by an opening edge 26. The central opening 24 is aligned with the region in which the integrated circuit component 14 is to be placed. The first layer 22 is spaced from the base layer 16 by selectively disposed insulating material 28a, 28b, typically glass, ceramic, plastic, or an organic material. Any insulating material 28a, 28b can be used which has sufficient insulating characteristics and which can be readily produced and manufactured and adhered to the base layer 16 and first layer 22. Preferably, the insulating material 28 is itself adhesive so that no additional adhesive material is required. The insulating material 28a, 28b can be provided in the form of a continuous bead parallel to the edges of the first plate 22. Alternatively, either the interior insulating material 28b or exterior insulating material 28a can be in the form of spaced regions or pillars of insulating material, as depicted in FIG. 4, 28'c, 28d, 28e, 28f. Preferably, the exterior edge insulating material 28a is a continuous bead of glass or organic material and forms a seal between the base layer 16 and the first layer 22 so that, as explained below the entire package, when completed, will form a sealed housing for the integrated circuit component 14. Preferably, the pillars 28'c-28'f are made of a polyimide material The insulating material 28a, 28b results in the first layer 22 being spaced from the base layer 16. Preferably, the distance 32 (FIG. 2) between the base layer 16 and the first layer 22 is less than about 0.015 inches (about 0.4 millimeters), preferably less than about 0.01 inches (about 0.25 millimeters) and most preferably about 0.004 to 0.006 inches (about 0.1 to 0.15 millimeters).

In those embodiments in which the base layer 16 is not electrically conductive, it may be preferable to mount the first layer 22 directly on the base layer 16. The volume 33 between the base layer 16 and first layer 22 which is not occupied by the first insulating material 28 is preferably filled with a gaseous material, most preferably air. The surface area of the portion of the lower surface of the first layer 22 which is adjacent the gas-filled region 33 is greater than about 50%, preferably greater than about 80%, of the total surface area of the lower surface of the first layer 22.

A second layer 34 is secured overlying and spaced from the first layer 22. The second layer 34 also has a central opening 36 defined by an edge 38. The central opening 38 of the second layer 34 is larger than the central opening 24 of the first layer 22 and thus exposes a portion 42 of the first layer 22 as well as the integrated circuit component 14. Preferably, the opening 36 exposes a region 42 entirely surrounding the central opening 24 of the first layer 22. At least a first continuous region of conductive material is exposed as part of the exposed portion 42. Since, in the preferred embodiment, the first layer 22 is a unitary sheet of conductive material, the exposed portion 42 is preferably a continuous shelf of conductive material.

The second layer 34 is spaced from the first layer 22 by insulating material 44a, 44b formed in a manner and made of materials similar to the insulating materials 28a, 28b separating the first layer 22 from the base layer 16. Either region of insulation material 44a, 44b can be provided in the form of pillars and preferably, the insulation material 44a adjacent the exterior edge is in the form of a continuous bead while the material 44'c, 44'd, 44'e are in the form of pillars, as depicted in FIG. 4.

The region 46 between the second layer 34 and first layer 22 which is not occupied by the first insulating material 44a, 44b is preferably filled with a gaseous material such as air. The surface area of the portion of the lower surface of the second layer 34 which is adjacent to the gas-filled region 46 is at least about 50% and preferably at least about 80% of the total lower surface area of the second layer 34. The distance 48 between the first layer and the second layer is preferably less than 0.015 inches (about 0.4 millimeters), more preferably less than about 0.01 inches (about 0.25 millimeters), and most preferably about 0.004 to 0.006 inches (about 0.1 to 0.15 millimeters).

A plurality of leads are typically provided during assembly in the form of a metalized substrate or a unitary lead frame 52, overlying and spaced from the second layer 34. The lead frame 52 includes a frame portion 54 and a plurality of inwardly extending, electrically conductive leads 56a-56u. The leads 56 are made of a conductive material such as a 42/45 copper alloy. The interior edges of the inwardly extending leads 56 define a central opening 58 of the lead frame 52. The end portions of the leads 56 are embedded in an insulating material 62 so that the leads and the material 62 in which the leads are embedded form a substantially planar layer 64.

The lead layer 64 is separated from the second layer 34 by insulating material 66a, 66b. The configuration and materials of the insulating material 66a, 66b are similar to those of the insulating materials 44a, 44b, 28a, 28b separating the second layer 34 from the first layer 22 and the first layer 22 from the base layer 16. Either portion of insulating material 66a,66b can be in the form of pillars (not shown) rather than the continuous beads 66a,66b depicted in FIG. 1.

The lead layer opening 58 is larger than the central opening 36 of the second layer 34 and thus exposes a portion 68 of the second layer 34. Since, in the preferred embodiment, the second layer 34 is a unitary sheet of conductive material, the exposed portion forms a continuous shelf 68 surrounding the central opening 36 of the second layer 34 and stepped back from the exposed shelf 42 of the first layer 22. The distance 72 which separates the lead layer 64 from the second layer 34 is preferably less than about 0.015 inches (about 4 millimeters), more preferably less than about 0.01 inches (about 0.25 millimeters), and most preferably about 0.004 to 0.006 inches (about 0.1 to 0.15 millimeters).

In one preferred embodiment, one or more of the leads 56c, 56k has an interior portion having a thickness less than that of the exterior portion. As seen in FIG. 2, a lead 56c which has a thickness in the range of about 0.006 to 0.01 inches (about 0.15 to 0.25 millimeters) is reduced in thickness in the interior portion so as to have an interior thickness 73 of about half the exterior thickness, or about 0.003 to 0.005 inches (about 0.07 to 0.12 millimeters). In this way, the lead 56c is sufficiently thick in the exterior portion to have the mechanical strength needed for manipulation and handling, while the reduced thickness in the interior portion provides for reduced capacitance. Preferably, all leads 56a–56y have reduced interior thickness.

In an alternative embodiment, depicted in FIg. 3, there is no second layer 34. Accordingly, the lead layer 64 overlies and is separated from the first layer 22.

The region 74 separating the lead layer 64 from the second layer 34 not occupied by the insulation material 66a,66b is preferably filled with a gaseous material such as air. The surface area of the lower surface of the lead layer 64 which is adjacent to the air-filled region 74 is greater than about 50%, preferably greater than about 80%, of the total lower surface area of the lead layer 64.

A cap 76 overlies and seals the entire package 12 The cap is spaced from the lead layer 64 by a perimetrical bead of insulating material 78 thus leaving interior upper surfaces of the leads 56 exposed. The cap 76 can be made from a plurality of materials including ceramic, glass, metal, plastic and the like.

Package 12 typically is hermetically sealed with the interior 82 being sealed by an envelope made up of the base layer 16, the cap 76 and perimetrical portions of the first, second and lead layers 22, 34, 64, and the insulating materials 28a, 44a, 66a, 78. The interior 82 of the sealed package 12 is preferably filled with a gaseous material, such as air. The insulating materials 28a, 44a, 66a, 78 extend a distance from the edge of the package towards the interior. In those packages for which hermeticity is desired, the width of the strip of insulating material 28a, 44a, 66a, 78 which is needed to achieve hermeticity depends upon the material being used for the sealing layers. As an example, when the upper sealing layer 78 is a polyimide material, hermeticity will typically require a width 83 of about 0.03 inches (about 0.75 millimeters). As can be seen from FIG. 2, the amount of width 83 occupied by the sealing material 78, 66a, 66b, 44a, 44b, 28a, 28b reduces the volume available for the gas dielectric 33, 46, 74, 82. Accordingly, in embodiments where hermeticity is critical, the amount of gas dielectric provided, and the consequent amount of reduction in capacitance, may be diminished compared to packages in which hermeticity is less critical, and in which the width 83 of the sealing layers 78, 66a, 66b, 44a, 44b, 28a, 28b can be relatively less. In instances in which both low capacitance and high hermeticity are needed, a smaller width 83 of the sealing layers, such as layer 78, can be achieved by using a material for the sealing layer 78, which is highly gas-impermeable.

In one embodiment, as depicted in FIG. 3, a bypass capacitor 94 is provided in one of the air-filled dielectric regions between layers and thereby is positioned physically close to the adjacent layers. As discussed above, such physically close placement assists in providing for rapid operation or speed of the device.

Interconnection or bond wires provide an electrical connection between one or more of the bonding pads 84a–84i of the integrated circuit component 14 and one or more of the first layer 22, second layer 34 and leads 56. The particular connections which are made depends on the characteristics of the integrated circuit component 14 and the pins on the package. One configuration is partially depicted in FIG. 1. The connections can include bond wires running from the bonding pads 84 to the first layer 86a, second layer 86b, third layer 86c,86d or base layer 86e. Connections can be made between layers as depicted by the bond wire 88 which connects the second layer 34 to the base layer 16 and bond wire 89, which connects a lead 56 to the second layer 34. The bond wires 86,88 can be made of a number of materials. Preferably, aluminum wire is used, but gold and copper are alternatives. Connections can be secured by soldering or welding. Preferably the maximum horizontal distance 87 between a bonding pad and any of the layers is about 0.15 inches (about 2.5 millimeters).

A variety of configurations of connections using bonding wires are possible, as may be needed to effect the desired functioning of the device. A single pad 84 can have two or more bond wires connecting the pad to different layers. Similarly, a single layer 22, 34, 64 can have a plurality of wires connecting that layer to various bond pads 84. Because layers can be interconnected with bond wires 88, there is no need for inter-layer vias as found in many previous devices. In one preferred embodiment, the first and second layers 22, 34 are connected so as to provide different voltages on the first and second layers 22, 34. In this way the first and second layers can be used, e.g., as a power plane 22 and a ground plane 34, respectively.

After the desired connections are made and the package 12 is sealed, the leads 56 are singulated by making a cut between the frame portion 54 and the leads 56 such as along line 92 and removing the frame portion 54. In use, the singulated leads 56 are connected to other circuitry components to provide the desired electrical connection to the integrated circuit component 14.

Because the first and second layers 22, 34 contain extended regions, preferably shelves 42, 68 along which connections can be made to those layers, the wiring is simplified and the package is more flexible than previous packages. The wiring is simplified because a given pad 84 is always adjacent to the continuous shelves 42, 48 so that connection to the first or second layer 22, 34 can be made by a bond wire without the necessity for the bond wire to cross over or under another bond wire in order to make the desired connection. The package 12 is more flexible because a variety of bond wire configurations and integrated circuit components can be used in a single package 12. In previous packages in which layers were provided in the form of individual connection pads, a change in wiring configuration often required reconfiguring the location of the pads so that connection could be made without unwanted crossing of wires. In the present invention, because the shelves 42, 68 are preferably continuous and surround the integrated circuit component, a change in the configuration of the bond wiring does not require a redesign of the package 12.

Because the major portion of the dielectric separating the various layers 64, 34, 22 is a low-dielectric gaseous material such as air, the effective R-C constant for various circuitry components in the package 12 is less than it would be if a higher dielectric material were used. Because the R-C constant is less, the device is able to operate more rapidly. Similarly, the speed of transmission is increased, approaching the speed of light, because the value of the dielectric constant of the material next to the conductive layers 22, 34, 64 is decreased compared to that of previous devices.

A number of advantages are provided by the package 12 of the present invention. The wiring between components and the package 12 can be easily provided in a variety of configurations. Inter-layer vias can be eliminated by using inter-layer bonding wires. Because wiring is simplified, it is typically not necessary to provide more than one layer of leads. This advantage is important because a lead frame is relatively more expensive than a simple planar layer. Components such as by-pass capacitors can be placed in the region between layers. The design is conducive to production of this low-profile packages. Configuration of the base layer is flexible in that it can be thermally conductive, relatively thermally nonconductive, electrically conductive, and/or relatively nonelectrically conductive. In this way, the package can be provided in a number of configurations depending on the desired use and can be both thermally enhanced and speed-enhanced (i.e. provide for rapidity of operation). The device uses readily available materials and can be made without providing or developing new types of materials.

A number of variations and modifications of the present invention can be used. The present invention can be used with more or fewer layers than those described and depicted. Gaseous dielectric could be used to separate some layers while a solid dielectric is used next to other layers. It is possible to use more than one lead or tape layer and/or more than two stadium-type or shelf layers. The leads 56 can be provided in a manner other than by production using a lead frame. Connections could be made by leads extending through the top or bottom surface of the package 12, although such a configuration is typically relatively expensive. The order of the various layers can be changed such that any of the ground, power, lead or other layers can overlie or underlie the others. Some or all of the connections which are depicted as using wire bonds or leads in the lead frame can also be provided using tape automated bonding (TAB). The package could be configured so that the stadium-stepped shape is provided on fewer than the four sides of the opening as depicted. The package could be configured so that shelves of different layers are exposed on different sides or portions of sides of the central opening. The package can be configured so that the shelves extend only part way around the central opening or part way along a single side of the central opening. The dielectric material which spaces layers can be provided in forms other than beads or columns such as continuous or intermittent sinuous forms, regions spaced away from the edges of the layers and the like. In order to prevent corrosion or other degradation of materials, the air can be treated, such as by drying for removal of particulates or undesired components. A gaseous material other than air can be used such as nitrogen, argon and the like. The space between layers can be occupied by a vacuum rather than by air.

EXAMPLE

Electrical parameters of the package 12 as well as for a more conventional package were modeled using a boundary element method. In the model, the leads were taken to be 0.005 inches (about 0.13 millimeters) in thickness, with a 0.005 inch (about 0.13 millimeters) distance apart. In a first model of the present invention (Model "A"), the distance from the lead plane to the ground plane was 0.005 inches (about 0.13 millimeters). In the first model the leads were modeled as being formed of copper. In a second model of the present invention (Model "B"), the leads were modeled as being formed of alloy 42 which is a magnetic material. Model B was otherwise similar to Model A. In a model of the previously provided devices, the lead layer was separated from the ground plane by 0.05 inches (about 1.3 millimeters) and the dielectric constant of the material between the lead plane and the ground place was taken as 4.0, typical of the dielectric constant of plastics. The results of the modeling are depicted in Table 1.

TABLE 1

|  | Lead Self-Inductance (nanohenries cm$^{-1}$) | Adjacent Lead Mutual Inductance (nanohenries cm$^{-1}$) | Lead-to-Ground Plane Capacitance (picofarad cm$^{-1}$) | Adjacent Lead Capacitance (picofarad cm$^{-1}$) |
|---|---|---|---|---|
| Model "A" (present invention) | 3.06 | 1.08 | 0.42 | 0.15 |
| Model "B" (present invention) | 4.56 | ~1.5 | 0.42 | 0.15 |
| Model "C" (previous devices) | 6.97 | 4.72 | 1.15 | 0.81 |

As can be seen from Table 1, Models A and B indicate that the present invention would have a lead self-inductance, adjacent lead mutual inductance, lead-to-ground plane capacitance and adjacent lead capacitance less than the corresponding values for previous devices having plastic insulation material between layers. It is noted that because the modeled lead alloy in Model B is magnetic material, its inductance is increased with respect to Model A (though still less than Model C) and its capacitance is essentially unchanged with respect to Model A.

Although the description of the present invention has included a description of the preferred embodiment and various modifications and variations, other modifications and variations can also be used which come within the scope of the present invention, the present invention being described by the following claims.

What is claimed is:

1. A package for an integrated circuit component, the component having a plurality of contact pads on its surface, the package comprising:
   means for supporting said integrated circuit component;
   a first layer, connected to said means for supporting, having at least a first electrically conductive portion;
   a second layer with at least a first edge, said second layer having at least a first area which overlies and is spaced from said first layer, said second layer having at least a second electrically conductive portion;
   means for providing electrical connection between at least one of said contact pads and at least one of said first electrically conductive portion and said second electrically conductive portion; and
   at least a first dielectric material positioned between said first area and said at least part of said first layer, wherein said first dielectric material is a gaseous material.

2. A package, as claimed in claim 1, wherein said gaseous material is air.

3. A package, as claimed in claim 1, wherein said first dielectric material separates said first electrically conductive portion of said first layer from the major part of said second electrically conductive portion of said second layer.

4. A package, as claimed in claim 1, wherein the surface area of said first layer is greater than the surface area of said second layer, and wherein part of said first layer extends laterally beyond said edge of said second layer.

5. A package, as claimed in claim 1, wherein at least one of said first and said second layers includes a plurality of leads electrically insulted from one another.

6. A package, as claimed in claim 1, wherein at least one of said first and said second layers is a planar electrically conductive sheet.

7. A package, as claimed in claim 1, further comprising:
   a second dielectric material positioned between said first layer and said second layer to maintain said first and second layers in a spaced-apart configuration.

8. A package, as claimed in claim 1, where said first and second layers are spaced apart a distance of less than about 0.006 inches.

9. A package usable for providing electrical connections between an integrated circuit component and another electrical component, the package comprising:
   a base layer having means for supporting an integrated circuit component;
   a first layer having a first central opening, said first opening having at least a first edge, said first layer positioned overlying and spaced from said base layer, said first central opening substantially aligned with said means for supporting an integrated circuit, said first layer including a substantially planar electrically conductive first region adjacent to at least a portion of said first edge;
   a second layer lying substantially in a plane, selected from a lead frame and a metalized substrate, defining a second central opening, said second opening having at least a second edge, at least a portion of said second opening substantially aligned with said first opening, said second layer including a plurality of electrically conductive leads which are electrically insulated from one another, at least a portion of said leads extending in a direction outward from said central opening to provide for electrical connection of said package to said other electrical component, at least a first of said leads terminating at said second edge, wherein all leads in said package have at least a portion lying in the plane of said second layer;
   first interconnect means for providing electrical connection between said integrated circuit component and said first edge;
   second interconnect means for providing electrical connection between said integrated circuit component and at least said first lead; and
   third interconnect means for providing electrical connection between said first region and at lest one of said plurality of leads adjacent said second edge, in the absence of vias.

10. A package, as claimed in claim 9, wherein said first layer is a ground plane for providing a first voltage to said integrated circuit component.

11. A package, as claimed in claim 10, further comprising:
    a power plane spaced from said ground plane, for providing a second voltage to said integrated circuit component, said power plane having a third central opening, at least a portion of said third opening being substantially aligned with said first central opening, said third opening having a third edge;
    interconnect means for providing electrical connection between said third edge and said integrated circuit component.

12. A package, as claimed in claim 9, wherein said base layer has a thermal conductivity greater than about 2 watt $cm^{-1}\cdot K^{-1}$ and wherein said integrated circuit component is mounted directly on said base layer to provide heat transfer to said base layer.

13. A package, as claimed in claim 9, wherein said base layer comprises at least 95 weight percent copper.

14. A package for an integrated circuit component having a plurality of contact pads along its periphery, comprising:
    an electrically conductive base means for supporting an integrated circuit component;
    an electrically conductive first layer separated from and secured to said base means by selectively disposed insulating material such that an open region is formed between the base member and the first layer so as to allow air in the open region to act as a dielectric insulator between the first layer and the base means, the first layer having a central opening therein to expose a central portion of the base means to which the integrated circuit component is to be attached;
    an electrically conductive second layer separated from and secured to said first layer by selectively disposed insulating material such that an open region is formed between the second layer and the first layer so as to allow air in the open region to act as a dielectric insulator between the second layer and the first layer, the second layer having a central opening therein, larger than the central opening in the first layer, to expose a portion of the first layer and to expose the central portion of the base means to which the integrated circuit component is to be attached;

an electrically conductive third layer separated from and secured to said second layer by selectively disposed insulating material such that an open region is formed between the third layer and the second layer so as to allow air in the open region to act as a dielectric insulator between the third layer and the second layer, the third layer comprising a plurality of conductive chip connection leads extending from an interior portion so as to define a central opening, larger than the central opening in the second layer, to expose a portion of the first and second layers and to expose the central portion of the base means to which the integrated circuit component is to be attached, to an exterior position beyond the periphery of the base for connecting to external circuitry; and a lid separated from and secured to said third layer by selectively disposed insulating material.

15. A package, as claimed in claim 14, wherein said first layer is electrically connected to said integrated circuit component for providing a ground voltage thereto, and further comprising:

an electrically conductive fourth layer secured between said second layer and said third layer and separated therefrom by selectively disposed insulating material such that an open regions are formed between said second layer and said fourth layer and between said fourth layer and said third layer so as to allow air in the open regions to act as a dielectric insulator between the second and fourth layers and the fourth and third layers, the fourth layer having a central opening therein to expose the central portion of the base member to which the integrated circuit is to be attached, said fourth layer electrically connected to said integrated circuit component for providing a power voltage thereto.

16. A package useful for providing electrical connections between an integrated circuit component and another electrical component, the package comprising:

a base layer having means for supporting an integrated circuit component; and a lead frame coupled to said base layer, including a plurality of electrically conducting leads which are electrically insulated from one another, at least a first portion of said leads lying substantially in a first plane and extending in a direction outward from the edge of said base layer to provide for electrical connection of said package to said other electrical component, at least a first of said leads having a first thickness, in a direction traverse to said first plane, in said first portion, and having a second thickness, in a direction traverse to said first plane, in a second portion, said second portion being closer to said means for supporting than said first portion, said second thickness being less than said first thickness.

* * * * *